United States Patent
Hayashi et al.

(10) Patent No.: US 11,469,680 B2
(45) Date of Patent: Oct. 11, 2022

(54) POWER CONVERTER

(71) Applicant: DENSO CORPORATION, Kariya (JP)

(72) Inventors: Atsushi Hayashi, Susono (JP); Hiromi Yamasaki, Toyota (JP); Kazuki Hayashi, Susono (JP)

(73) Assignee: DENSO CORPORATION, Kariya (JP)

( * ) Notice: Subject to any disclaimer, the term of this patent is extended or adjusted under 35 U.S.C. 154(b) by 168 days.

(21) Appl. No.: 17/111,626

(22) Filed: Dec. 4, 2020

(65) Prior Publication Data
US 2021/0288588 A1    Sep. 16, 2021

(30) Foreign Application Priority Data
Mar. 12, 2020  (JP) .............................. JP2020-043148

(51) Int. Cl.
| H02M 7/00 | (2006.01) |
| H02M 7/48 | (2007.01) |
| H05K 7/20 | (2006.01) |
| H01M 8/04 | (2016.01) |

(52) U.S. Cl.
CPC ............. *H02M 7/003* (2013.01); *H01M 8/04* (2013.01); *H02M 7/48* (2013.01); *H05K 7/209* (2013.01); *H05K 7/20927* (2013.01); *H01M 2250/20* (2013.01)

(58) Field of Classification Search
CPC ........... H02M 7/003; H02M 7/48; H01M 8/04
See application file for complete search history.

(56) References Cited

U.S. PATENT DOCUMENTS

| 10,625,609 B2* | 4/2020 | Kitazawa ................ H02P 27/06 |
| 2019/0174647 A1* | 6/2019 | Umeda ............... H02M 3/1584 |

FOREIGN PATENT DOCUMENTS

JP         2012-105369 A        5/2012

* cited by examiner

*Primary Examiner* — Adolf D Berhane
*Assistant Examiner* — Afework S Demisse
(74) *Attorney, Agent, or Firm* — Oliff PLC

(57) ABSTRACT

A current sensor is provided on a bus bar via which a reactor is connected to a power module. The reactor is separated from the current sensor by a partition made of metal having a magnetic shielding effect. An output terminal of the reactor is provided on either one of a surface of the reactor on a first side and a surface of the reactor on a second side, the first side being farther from a mounting surface of a power converter across a plane passing through the center of the reactor, the second side being closer to the mounting surface from the plane.

7 Claims, 8 Drawing Sheets

POWER CONVERTER

CROSS-REFERENCE TO RELATED APPLICATION

This application claims priority to Japanese Patent Application No. 2020-043148 filed on Mar. 12, 2020, incorporated herein by reference in its entirety.

BACKGROUND

1. Technical Field

The present disclosure relates to a power converter to be provided in a fuel cell unit.

2. Description of Related Art

As described in Japanese Unexamined Patent Application Publication No. 2012-105369 (JP 2012-105369 A), for example, there has been known a power converter provided in a fuel cell unit. Fuel cell units to be provided in electric vehicles are demanded for further downsizing due to spatial restriction of a mount space in the vehicles. This demand also applies to power converters constituting the fuel cell units.

The power converters include reactors. Due to heat generation by core loss in addition to heat generation by conduction loss of coils, the temperature of the reactors particularly easily becomes high among component parts provided in the power converters. As the power converters are downsized, influences on the component parts, particularly on current sensors become larger. The current sensors have a low heat-resistant temperature as compared with other component parts and are placed close to the reactors. Further, magnetic fluxes leaking out from the reactors reduce the measuring accuracy of current values measured by the current sensors. As the distance between a reactor and a current sensor is reduced due to downsizing of the power converters, the influence of a leakage flux from the reactor on the current sensor increases.

SUMMARY

The present disclosure is accomplished in view of the above problems, and an object of the present disclosure is to reduce the influence of heat and a leakage flux from a reactor on a current sensor in a power converter to be provided in a fuel cell unit.

A power converter according to the present disclosure is a power converter to be provided in a fuel cell unit and includes a reactor, a power module, a bus bar, a current sensor, and a partition. The power module is placed side by side with the reactor along a mounting surface of the power converter. An output terminal of the reactor is connected to an input terminal of the power module via the bus bar. The current sensor is provided on the bus bar. The partition is made of metal having a magnetic shielding effect, the partition being configured to separate the reactor from the current sensor. The partition is made of metal having a magnetic shielding effect, so that the partition reduces the influence of radiant heat from the reactor on the current sensor and also reduces the influence of leakage fluxes on the current sensor.

In the power converter according to the present disclosure, the output terminal of the reactor is provided on either one of a surface of the reactor on a first side and a surface of the reactor on a second side, the first side being a side farther from the mounting surface across a plane passing through a center of the reactor and parallel to the mounting surface, the second side being a side closer to the mounting surface from the plane. On a side opposite to a side where the output terminal of the reactor is provided out of the first side and the second side, the bus bar extends to pass through the partition from a space where the reactor is placed to a space where the current sensor is placed. Since such a positional relationship is provided between the position of the output terminal of the reactor and the position where the bus bar passes through the partition, a long bus bar length is secured from the reactor to the current sensor, and heat transfer from the reactor to the current sensor via the bus bar is reduced.

In the power converter according to the present disclosure, the partition may include a wall portion standing from the mounting surface, and a bottom portion placed between the reactor and the mounting surface and connected to the wall portion. The wall portion may be connected to a ceiling of a space where the power module and the current sensor are placed. When the partition is provided as such, the reactor is isolated from the space where the current sensor is provided, and heat transfer from the reactor to the current sensor via air is also reduced.

In the power converter according to the present disclosure, the output terminal of the reactor may be provided on the surface of the reactor on the first side. The input terminal of the power module may be provided on a surface of the power module, the surface facing the mounting surface. The bus bar may pass through an end part of the wall portion on the second side and may be connected to the input terminal of the power module. With such a positional relationship, the bus bar can be routed orderly from the reactor to the power module while the bus bar length from the reactor to the current sensor is secured. Further, with such a positional relationship, since the bus bar length from the current sensor to the input terminal of the power module is shortened, heat in a part where the current sensor is provided can be removed by coolant that cools the power module. A water-cooling cooler configured to cool the reactor may be attached to the surface of the reactor on the second side.

In the power converter according to the present disclosure, a part of the bus bar at least from the partition to the input terminal of the power module may be formed straight. Magnetic fluxes corresponding to the magnitude of a current are generated around the bus bar. In a case where a part of the bus bar from the partition to the input terminal of the power module is formed straight, the magnetic fluxes are unidirectional, so that magnetic fluxes in various directions are restrained from acting on a part where the current sensor is provided. That is, a decrease in measuring accuracy of a current value measured by the current sensor is restrained. The bus bar may be bent in a part from the output terminal of the reactor to the partition. In order to connect the output terminal of the reactor to the input terminal of the power module, it is necessary that the bus bar be bent once or several times. When the bus bar is bent on a side opposite to the current sensor across the partition, it is possible to restrain magnetic fluxes generated in other parts and having different directions from acting on the part where the current sensor is provided.

In the power converter according to the present disclosure, a plurality of reactors may be provided in line on the mounting surface. In this case, respective bus bars are provided for the reactors, so that the reactors provided in line are connected to a single power module in parallel via the respective bus bars. Respective current sensors are provided for the bus bars. The partition may be provided along the line of the reactors. As to one current sensor, the partition reduces heat and leakage fluxes from a reactor corresponding to the current sensor and also reduces the influence of heat and leakage fluxes from other reactors.

As has been described above, with the power converter of the present disclosure, the partition made of metal and separating the reactor from the current sensor reduces the influence of radiant heat from the reactor on the current sensor and also reduces the influence of leakage fluxes on the current sensor. Further, a long bus bar length is secured from the reactor to the current sensor, and heat transfer from the reactor to the current sensor via the bus bar is reduced.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

With reference to the drawings, the following describes embodiments of the present disclosure. Note that, when a number such as the number, quantity, amount, or range of elements is referred to in the following embodiments, the present disclosure is not limited to the referred number except when the number is particularly explicitly indicated or the elements are obviously specified to the number in principle. Moreover, structures and so on described in the following embodiments are not necessarily indispensable to the present disclosure except when they are particularly explicitly indicated or obviously specified in principle.

Figure 1:
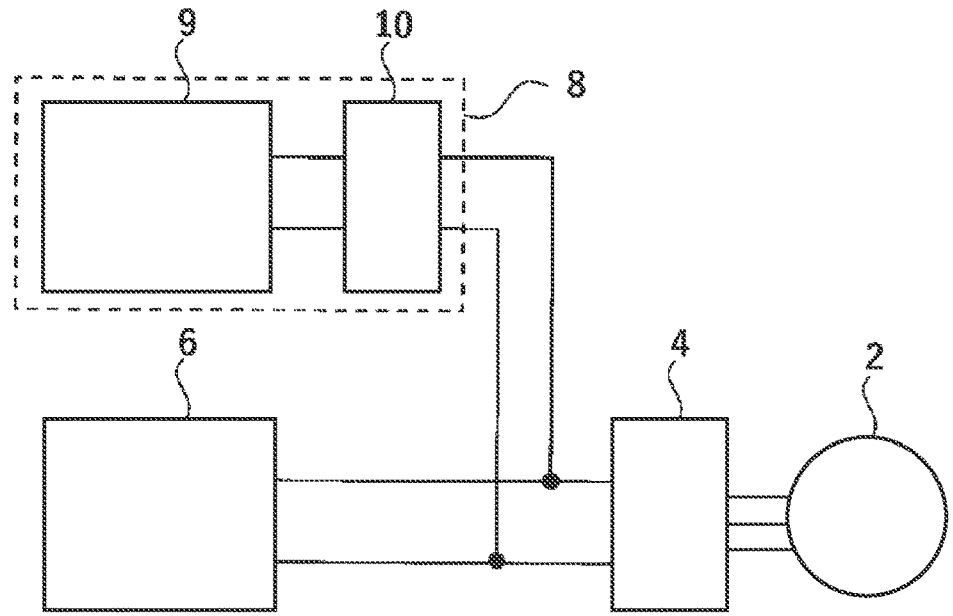
FIG. 1 is a schematic view of a power train system of a fuel cell vehicle.

FIG. 1 is a schematic view of a power train system of a fuel cell vehicle. The fuel cell vehicle is a vehicle configured to travel by driving force generated by an electric machine 2 by driving the electric machine 2 by electricity generated by a fuel cell stack 9. The electric machine 2 is a motor generator operable as a generator. A battery 6 is connected to the fuel cell stack 9 and the electric machine 2. The battery 6 is configured to supply electricity to the electric machine 2 when the fuel cell stack 9 cannot sufficiently generate electricity, and during regenerative operation, electricity generated by the electric machine 2 is stored in the battery 6. Since the electric machine 2 is an alternating current motor, the fuel cell stack 9 and the battery 6 are connected to the electric machine 2 via an inverter 4 configured to convert a direct current into an alternating current.

A power converter 10 configured to boost the voltage of electricity generated by the fuel cell stack 9 is attached to the fuel cell stack 9. More specifically, the power converter 10 is a boost converter. For the fuel cell stack 9 to be provided in a fuel cell vehicle, cost reduction and downsizing are problems to be solved. The problems can be solved by reducing the number of cells. However, when the number of cells is reduced, a total voltage of the whole fuel cell stack 9 decreases. On this account, in order to increase an output voltage to a necessary voltage, an output portion of the fuel cell stack 9 requires the power converter 10. In order to enable efficient arrangement in a limited space of the vehicle, the fuel cell stack 9 and the power converter 10 are provided as a single fuel cell unit 8.

Figure 2:
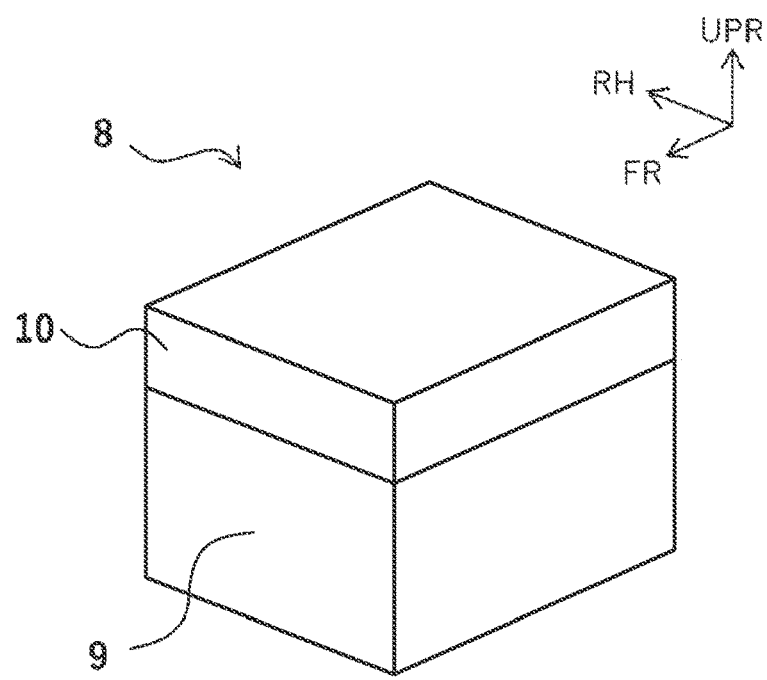
FIG. 2 is a schematic view illustrating a structure of a fuel cell unit.

Hereinafter, in the present specification, the fuel cell unit is referred to as an FC unit, and the fuel cell stack is referred to as an FC stack. Further, the power converter as a boost converter is a DC-DC converter for a fuel cell, and therefore, in the following description, the power converter is referred to as an FDC. The outline of the structure of the FC unit 8 is illustrated in FIG. 2. The FC unit 8 is configured by integrating the FC stack 9 and the FDC 10. The FDC 10 is provided on the FC stack 9 such that the FDC 10 is superimposed on the FC stack 9. Hereinafter, a surface, of the FDC 10, that is attached to the FC stack 9 is refers to as a mounting surface where the FDC 10 is provided in the FC unit 8.

Figure 3:
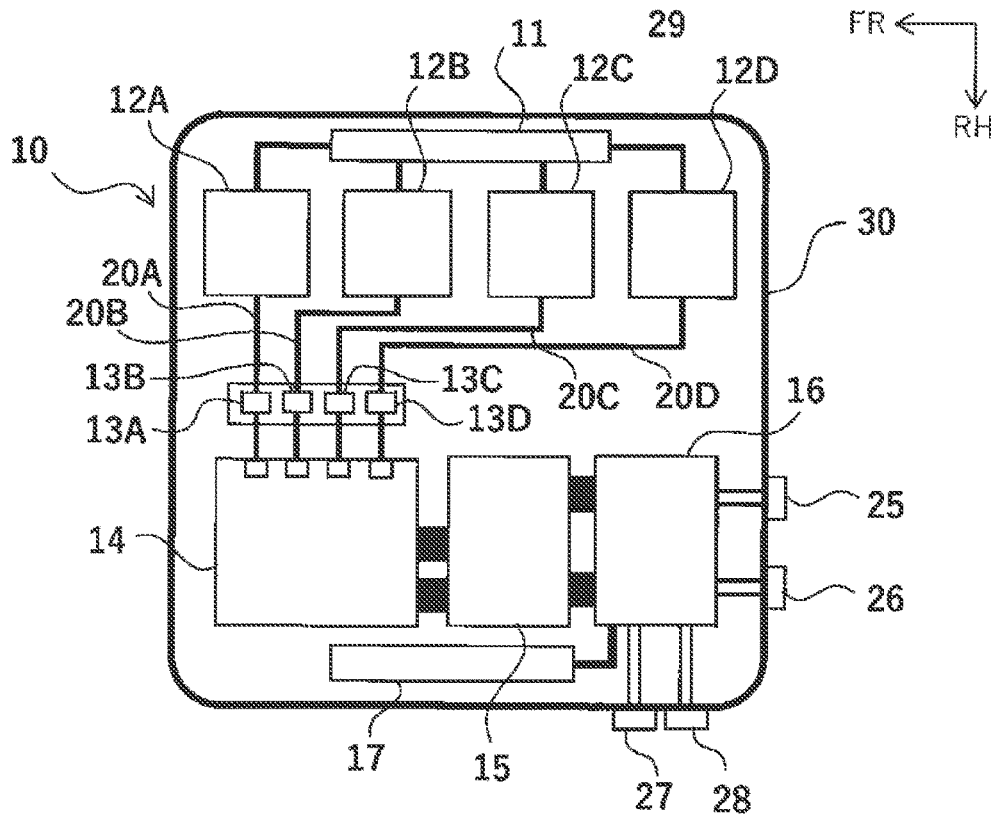
FIG. 3 is a bottom view in a state where a reactor cooler is removed and illustrates a positional relationship and an electrical connection relationship between component parts of a power converter according to a first embodiment.

FIG. 3 is a bottom view in a state where a reactor cooler is removed and illustrates a positional relationship and an electrical connection relationship between component parts of the FDC 10 according to the first embodiment. Inside a case 30 of the FDC 10, a P terminal 11, reactors 12A, 12B, 12C, 12D, current sensors 13A, 13B, 13C, 13D, an intelligent power module (IPM) 14, a capacitor 15, a branch box 16, and an N terminal 17 are placed. Among them, the P terminal 11 and the N terminal 17 are terminals via which the FDC 10 is connected to the FC stack 9. The P terminal 11 is placed in an end part, of the case 30, on a first side in the vehicle width direction and is connected to a P bus bar (not shown) extending from the FC stack 9. The N terminal 17 is placed in an end part, of the case 30, on a second side in the vehicle width direction and is connected to an N bus bar (not shown) extending from the FC stack 9.

The FDC 10 is a multiphasic boost converter and includes four reactors 12A to 12D of phase 1 to phase 4. The reactors 12A to 12D are arranged in line evenly along the vehicle front-rear direction near the P terminal 11. The reactors 12A to 12D are connected to the P terminal 11 in parallel by use of bus bars. The reactors 12A to 12D as heat generators are cooled by a water-cooling reactor cooler (not shown).

The reactors 12A to 12D are connected to the IPM 14 in parallel via bus bars 20A, 20B, 20C, 20D. The IPM 14 is a power module including a plurality of power cards laminated with coolers being sandwiched between the power cards. The power card is configured such that an IGBT constituting an inverter and a diode are packaged integrally. Coolant for a coolant circulatory system, the coolant being cooled by a radiator (not shown), is supplied to the coolers in the IPM 14. The coolant passing through the coolers in the IPM 14 is supplied to the aforementioned reactor cooler. The current sensors 13A, 13B, 13C, 13D are respectively attached to the bus bars 20A, 20B, 20C, 20D via which the reactors 12A to 12D are connected to the IPM 14. The current sensors 13A to 13D are Hall-element type current sensors each including a magnetic core that a bus bar penetrates and a Hall element inserted into a gap of the magnetic core.

The IPM 14 is placed side by side with the current sensors 13A to 13D in a direction perpendicular to a direction where the reactors 12A to 12D are arranged. The capacitor 15 for smoothing is connected to an output side of the IPM 14 by use of a bus bar. The branch box 16 is connected to the capacitor 15 by use of a bus bar. The N terminal 17 is connected to the branch box 16 by use of a bus bar. The IPM 14, the capacitor 15, and the branch box 16 are arranged in line along the vehicle front-rear direction near the N terminal 17. An output terminal 25 for a battery, an output terminal 26 for a PCU, an output terminal 27 for an inverter of an air compressor, and an output terminal 28 for the air compressor are connected to the branch box 16. The output terminals 25, 26, 27, 28 are provided on the outside of the case 30.

Next will be described a problem related to the FDC 10.

Figure 4:
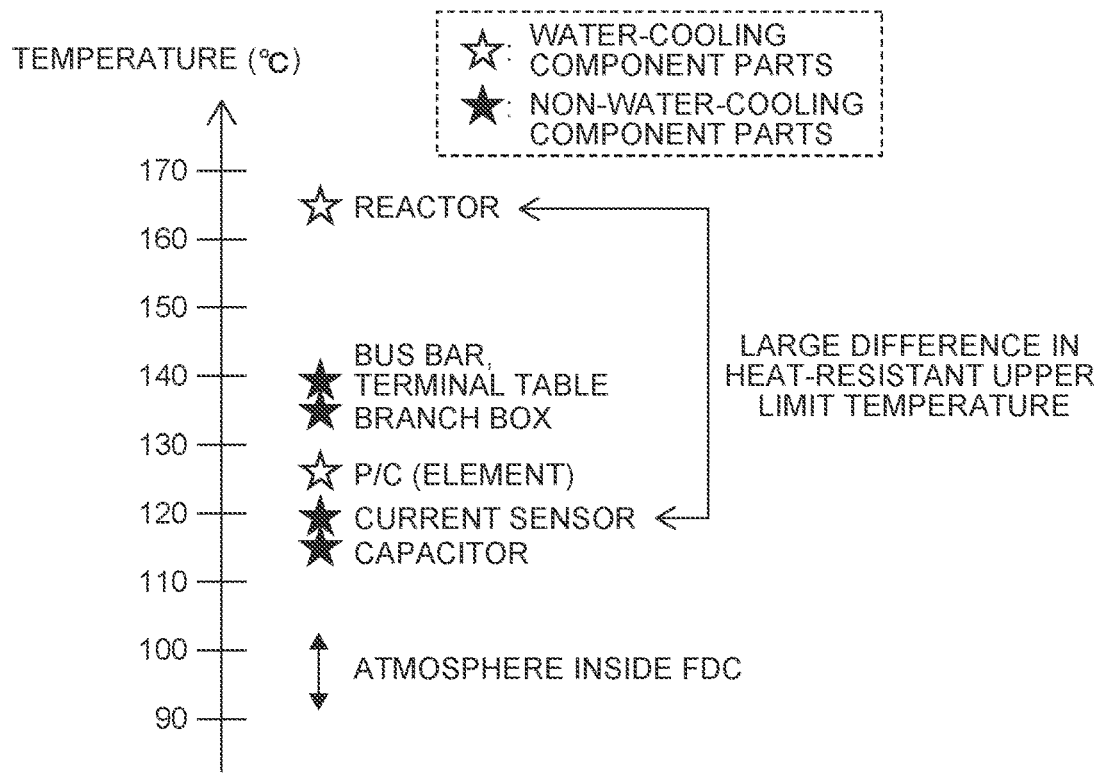
FIG. 4 is a view to describe heat-resistant temperatures of the component parts of the power converter.

Examples of heat-resistant upper limit temperatures of component parts of the FDC 10 are illustrated in FIG. 4. The component parts have different heat-resistant upper limit temperatures. The component parts with the highest heat-resistant upper limit temperature are the reactors 12A to 12D as heat generators. The reactors 12A to 12D are cooled by coolant so as not to exceed their heat-resistant upper limit temperature. In the meantime, the heat-resistant upper limit temperatures of the current sensors 13A to 13D and the capacitor 15 are around 110° C. to 120° C. and are particularly lower than those of the other component parts. In the examples illustrated in FIG. 4, the heat-resistant temperature of the capacitor 15 is lower than that of the current sensors 13A to 13D, but the heat-resistant temperature of the current sensors 13A to 13D might be lower than that of the capacitor 15 depending on products. Water cooling with coolant is performable on the reactors 12A to 12D and the IPM 14, whereas it is difficult to perform water cooling on the current sensors 13A to 13D and the capacitor 15.

The current sensors 13A to 13D and the capacitor 15 are component parts that are necessary to be protected from heat. Particularly, for the necessity of downsizing the FDC 10, the current sensors 13A to 13D are placed near the reactors 12A to 12D as heat generators. On this account, if any measures are not taken, the current sensors 13A to 13D would be exposed to radiant heat from the reactors 12A to 12D. Under the environment that the current sensors 13A to 13D are exposed to radiant heat from the reactors 12A to 12D, the temperatures of the current sensors 13A to 13D easily exceed their heat-resistant upper limit temperature. In view of this, as will be described later, the FDC 10 is provided with a structure that reduces the influence of radiant heat from the reactors 12A to 12D on the current sensors 13A to 13D.

The current sensors 13A to 13D are smaller in size than the reactors 12A to 12D. On this account, in a case where the current sensors 13A to 13D are collectively placed in one place, the bus bars 20A to 20D via which the reactors 12A to 12D are connected to the current sensors 13A to 13D have different lengths depending on phases. In the example illustrated in FIG. 3, the length of the bus bar 20A of phase 1 is the shortest, and the lengths of the bus bar 20B of phase 2, the bus bar 20C of phase 3, and the bus bar 20D of phase 4 become longer in this order. Heat is transferred to the current sensors 13A to 13D from the reactors 12A to 12D via the bus bars 20A to 20D. The amount of heat transfer via a bus bar is larger as the length of the bus bar is shorter.

Figure 5:
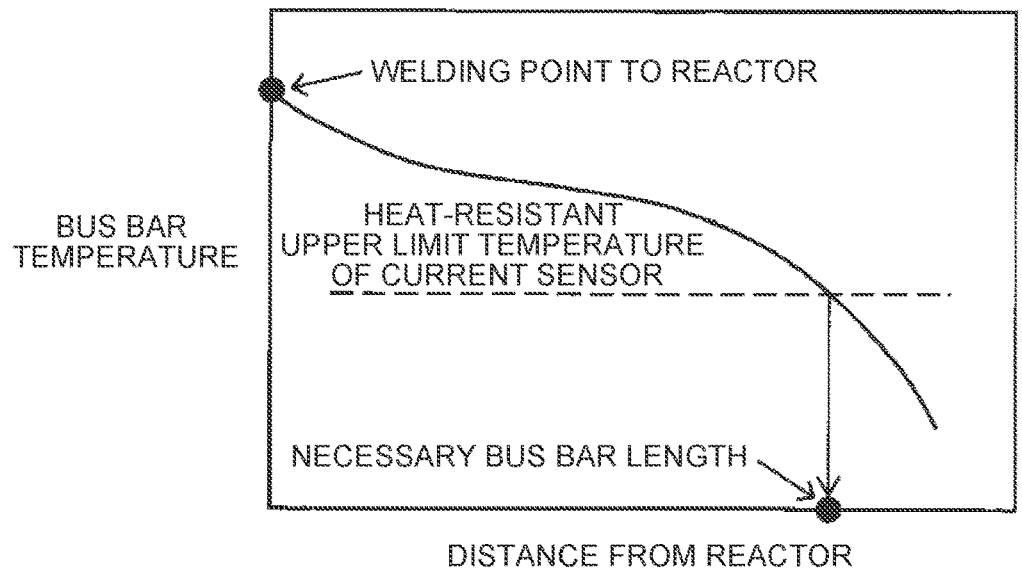
FIG. 5 is a view illustrating a relationship between temperature and length of a bus bar from a reactor to a current sensor.

FIG. 5 is a view illustrating a relationship between temperature and length of a bus bar from a reactor to a current sensor in a case where there is no temperature increase due to radiant heat. As illustrated in FIG. 5, in order to keep the temperature of the current sensor at its heat-resistant upper limit temperature or less, it is necessary to secure a predetermined bus bar length or more. In a case of a structure in which the reactor and the current sensor are placed on generally the same plane, in order to secure a necessary bus bar length, it is necessary to place the current sensor at a distance from the reactor. In the meantime, in order to downsize the FDC, it is necessary that the current sensor and the reactor be placed close to each other like the positional relationship between the current sensors 13A to 13D and the reactors 12A to 12D as illustrated in FIG. 3. In view of this, as will be described later, the FDC 10 is provided with a structure that reduces heat transfer from the reactors 12A to 12D to the current sensors 13A to 13D via the bus bars 20A to 20D.

Figure 6:
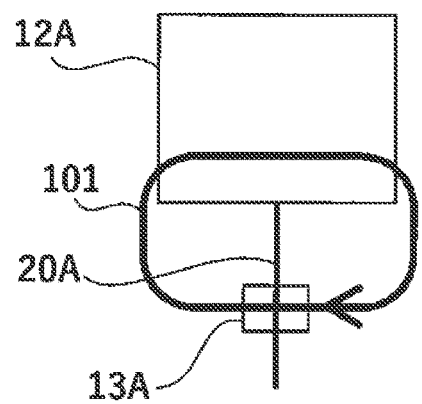
FIG. 6 is a view to describe a magnetic flux having an influence on measuring accuracy by the current sensor.
Figure 7:
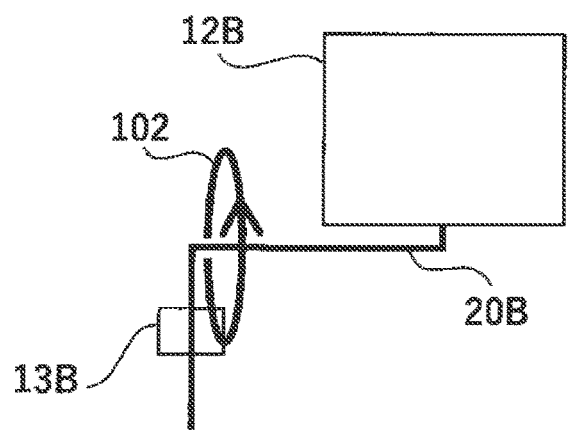
FIG. 7 is a view to describe a magnetic flux having an influence on measuring accuracy by the current sensor.

In addition to the problem about the influence of heat from the reactors 12A to 12D on the current sensors 13A to 13D as described above, the FDC 10 also has a problem about the influence of magnetic fluxes from outside on the current sensors 13A to 13D. FIGS. 6 and 7 are views to describe a magnetic flux having an influence on measuring accuracy by the current sensors 13A to 13D. Herein, only some reactors 12A, 12B, some current sensors 13A, 13B, and some bus bars 20A, 20B necessary for the description are illustrated.

A reactor increases a voltage by repeatedly turning on and off a switching element and repeating accumulation and discharge of magnetic energy. On this account, along with the operation of the reactor, magnetic fluxes leak out around the reactor. In the example illustrated in FIG. 6, at the time of the operation of the reactor 12A, a leakage flux 101 is generated around the reactor 12A. When the leakage flux 101 acts on the current sensor 13A, for example, the measuring accuracy by the current sensor 13A decreases. In view of this, as will be described later, the FDC 10 is provided with a structure that reduces the influence of leakage fluxes from the reactors 12A to 12D on the current sensors 13A to 13D.

When a current flows through a bus bar, magnetic fluxes corresponding to the magnitude of the current are also generated around the bus bar. In a case of the bus bar 20A extending straight from the reactor 12A as illustrated in FIG.

6, the magnetic fluxes generated around the bus bar 20A are unidirectional. On this account, magnetic fluxes in different directions can hardly act on a part where the current sensor 13A is provided. However, like the bus bar 20B illustrated in FIG. 7, in a case where the bus bar is bent in the middle of a route from the reactor 12B to the current sensor 13B, magnetic fluxes generated around the bus bar are not unidirectional. In this case, a part where the current sensor 13B is provided might be affected by a magnetic flux 102 generated in another part and having a different direction. When the current sensor 13B is exposed to the magnetic flux 102, the current sensor 13B might measure a current mistakenly. In view of this, as will be described later, the FDC 10 is provided with a structure that restrains magnetic fluxes generated in other parts and having different directions from acting on parts where the current sensors 13A to 13D are provided.

Figure 8:
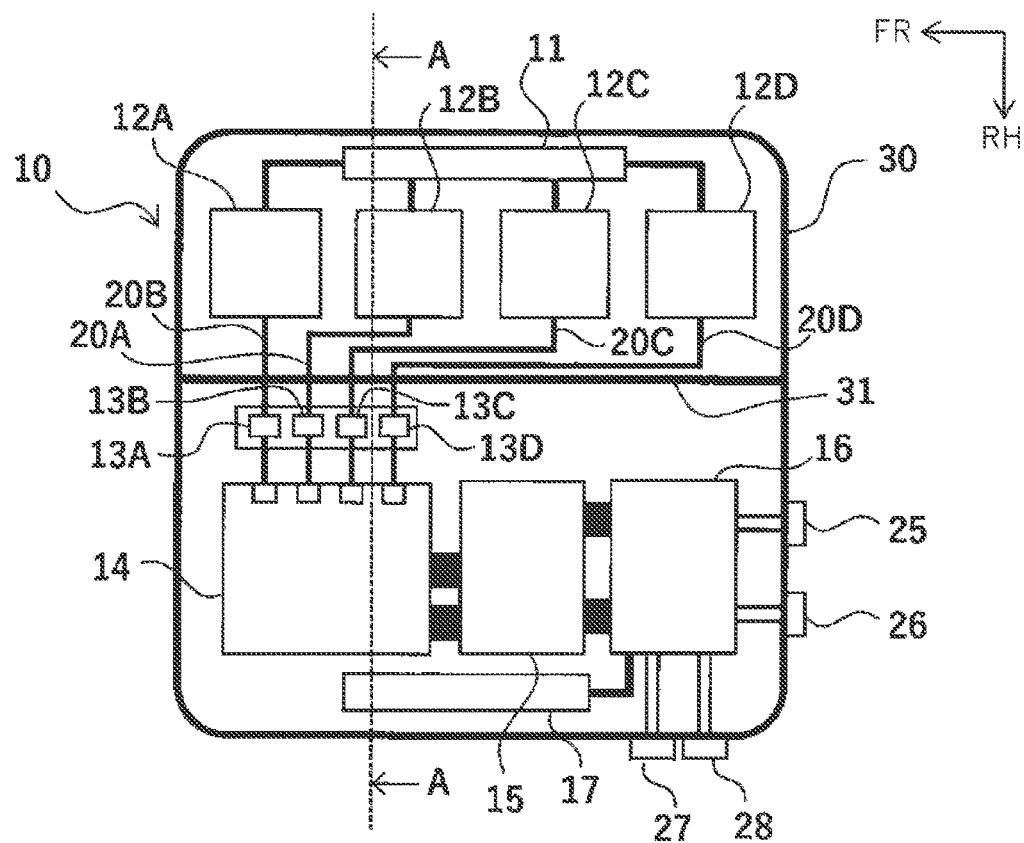
FIG. 8 is a bottom view in a state where the reactor cooler is removed and illustrates a positional relationship between a partition and the component parts of the power converter according to the first embodiment.

The following describes a detailed structure of the FDC 10 according to the first embodiment. As mentioned earlier, the FDC 10 is provided with a structure that reduces the influence of radiant heat from the reactors 12A to 12D on the current sensors 13A to 13D. The structure is a partition 31 illustrated in FIG. 8. FIG. 8 is a bottom view in a state where the reactor cooler is removed and illustrates a positional relationship between the component parts of the FDC 10 and the partition 31. The partition 31 is provided along the line of the reactors 12A to 12D so as to separate the reactors 12A to 12D from the current sensors 13A to 13D. Both end parts, in the vehicle front-rear direction, of the partition 31 are connected to the case 30. That is, the partition 31 divides the inside of the case 30 into a space on a side where the reactors 12A to 12D are provided and a space on a side where the current sensors 13A to 13D are provided. When such a partition 31 is provided, radiant heat emitted from the reactors 12A to 12D is blocked by the partition 31.

The partition 31 is made of metal, e.g., iron, that has a magnetic shielding effect. The partition 31 may be formed in combination of other materials, e.g., a heat insulation material having a heat insulation effect, with the metal having a magnetic shielding effect. In a case where the case 30 of the FDC 10 is made of metal having a magnetic shielding effect, the partition 31 may be made of the same material as the case 30. The partition 31 reduces the influence of radiant heat from the reactors 12A to 12D on the current sensors 13A to 13D and also reduces the influence of leakage fluxes from the reactors 12A to 12D on the current sensors 13A to 13D.

Figure 9:
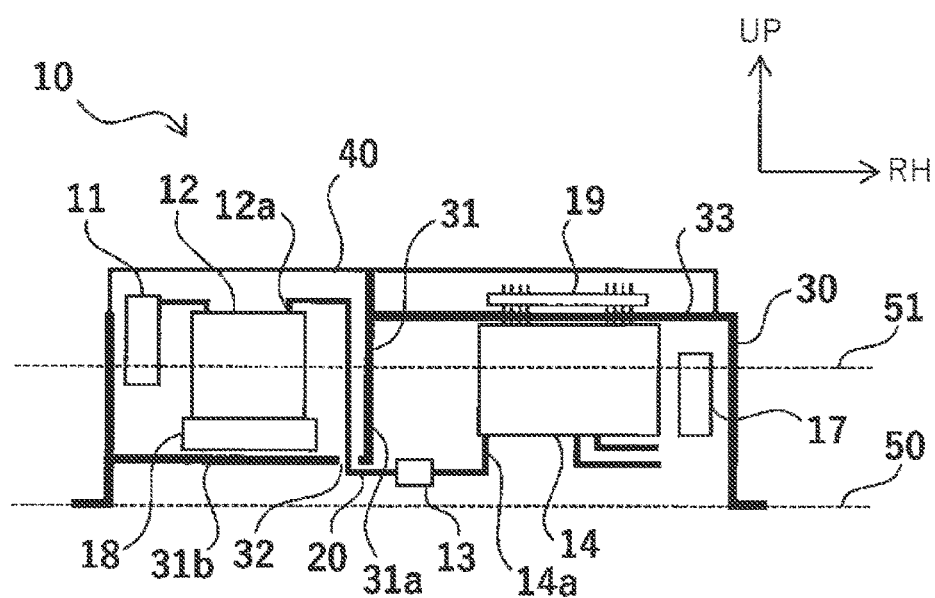
FIG. 9 is an arrow view illustrating a section taken along an arrow A-A in FIG. 8 and illustrates details of the structure of the power converter according to the first embodiment.
Figure 10:
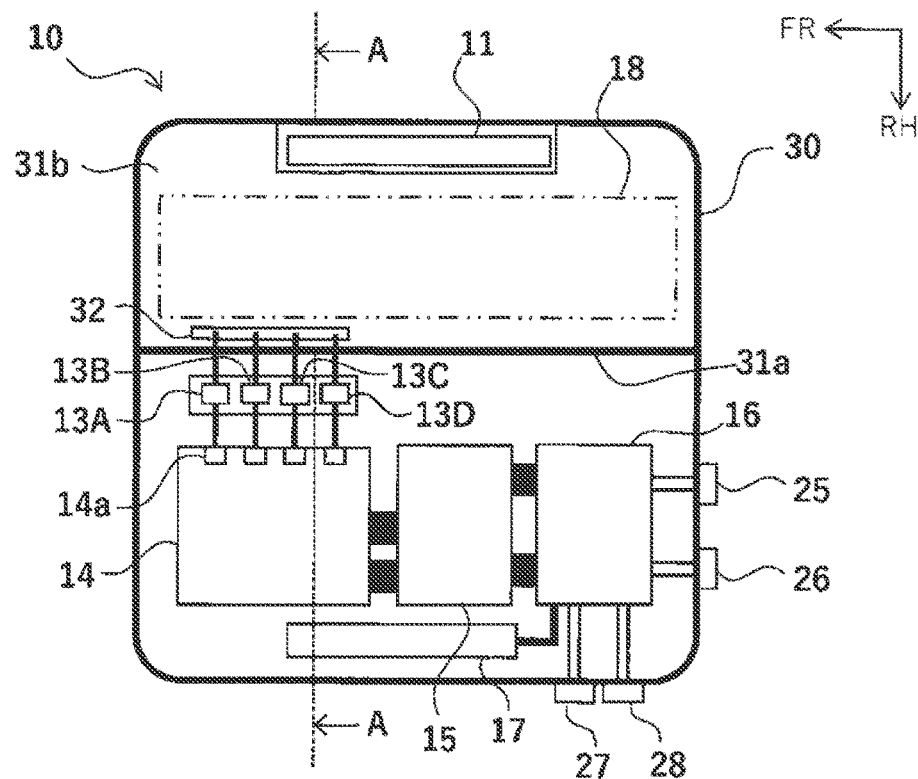
FIG. 10 is a bottom view illustrating details of the structure of the power converter according to the first embodiment.

FIG. 9 is an arrow view illustrating a section taken along an arrow A-A in FIG. 8 and illustrates details of the structure of the FDC 10 according to the first embodiment. In FIG. 9, a reactor 12 is representatively illustrated as the reactors 12A to 12D, a current sensor 13 is representatively illustrated as the current sensors 13A to 13D, and a bus bar 20 is representatively illustrated as the bus bars 20A to 20D. FIG. 10 is a bottom view illustrating details of the structure of the FDC 10 according to the first embodiment.

As illustrated in FIG. 9, the inside of the FDC 10 is partitioned off into two spaces by the partition 31. The partition 31 includes a wall portion 31a standing from the mounting surface 50 of the FDC 10, and a bottom portion 31b placed between the reactor 12 and the mounting surface 50 and connected to the wall portion 31a. As illustrated in FIG. 10, three edges of the bottom portion 31b are connected to side walls of the case 30, and one edge of the bottom portion 31b is connected to the wall portion 31a. The reactor 12 is accommodated in a space surrounded by the side walls of the case 30 of the FDC 10 and the partition 31. When the partition 31 is provided as such, the reactor 12 is isolated from the space where the current sensor 13 is provided, and heat transfer from the reactor 12 to the current sensor 13 via air is also reduced.

A reactor cooler 18 configured to cool the reactor 12 is provided between the reactor 12 and the bottom portion 31b of the partition 31. That is, a surface of the reactor 12 on the lower side is cooled by the reactor cooler 18. When a side farther from the mounting surface 50 across a plane 51 passing through the center of the reactor 12 and parallel to the mounting surface 50 is taken as a first side, and a side closer to the mounting surface 50 from the plane 51 is taken as a second side, the surface of the reactor 12 on the lower side is a second-side surface, and a surface of the reactor 12 on the upper side is a first-side surface. In the first embodiment, an output terminal 12a of the reactor 12 is provided on the surface of the reactor 12 on the upper side as the first-side surface.

The partition 31 has a hole 32 through which the bus bar 20 is passed. A position where the hole 32 is provided is a part of the bottom portion 31b, the part being close to the wall portion 31a. This position is a side (the second side) opposite, across the plane 51, to a side (the first side) where the output terminal 12a of the reactor 12 is provided. When such a positional relationship is provided between the position of the output terminal 12a of the reactor 12 and the hole 32 via which the bus bar 20 passes through the partition 31, a long bus bar length is secured from the reactor 12 to the current sensor 13. The amount of heat transfer via the bus bar 20 is smaller as the length of the bus bar 20 is longer. Accordingly, a temperature increase in the current sensor 13 due to heat transfer from the reactor 12 to the current sensor 13 via the bus bar 20 is reduced.

An input terminal 14a of the IPM 14 to which the bus bar 20 is connected is provided on a surface, of the IPM 14, that faces the mounting surface 50, that is, a surface of the IPM 14 on the lower side. In order to connect the output terminal 12a of the reactor 12 to the input terminal 14a of the IPM 14 via the bus bar 20, it is necessary that the bus bar 20 be bent several times. As apparent from FIGS. 8, 9, the bus bar 20 is bent on a side opposite to the current sensor 13 across the partition 31, that is, in an area between the output terminal 12a of the reactor 12 and the hole 32 of the partition 31, and a part of the bus bar 20 from the hole 32 of the partition 31 to the input terminal 14a of the IPM 14 is formed straight.

When the reactor 12 and the IPM 14 are placed in such a positional relationship, the bus bar can be routed orderly from the reactor 12 to the IPM 14 while the bus bar length from the reactor 12 to the current sensor 13 is secured. Further, with such a positional relationship, the bus bar length from the current sensor 13 to the input terminal 14a of the IPM 14 is shortened, so that heat in a part where the current sensor 13 is provided can be removed by coolant that cools the IPM 14.

Magnetic fluxes corresponding to the magnitude of the current are generated around the bus bar 20. Since the partition 31 is made of metal having a magnetic shielding effect, the magnetic fluxes generated from the bus bar 20 inside the partition 31 are restrained from acting on the current sensor 13. Further, since a part of the bus bar 20 from the partition 31 to the input terminal 14a of the IPM 14 is formed straight, the magnetic fluxes thus generated are unidirectional, thereby making it possible to restrain magnetic fluxes in various directions from acting on a part where the current sensor 13 is provided. That is, with the structure of the FDC 10 according to the first embodiment, a decrease in measuring accuracy of a current value measured by the current sensor 13 is reduced.

Figure 11:
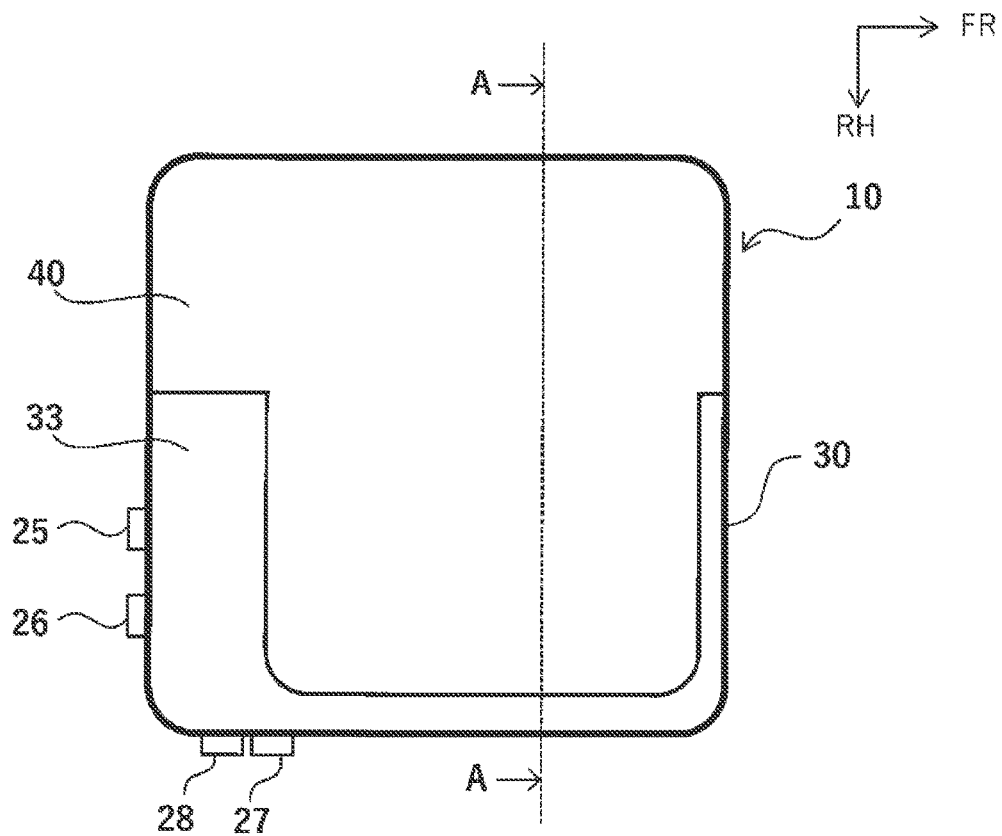
FIG. 11 is a top view in a state where an upper cover is attached and illustrates details of the structure of the power converter according to the first embodiment.
Figure 12:
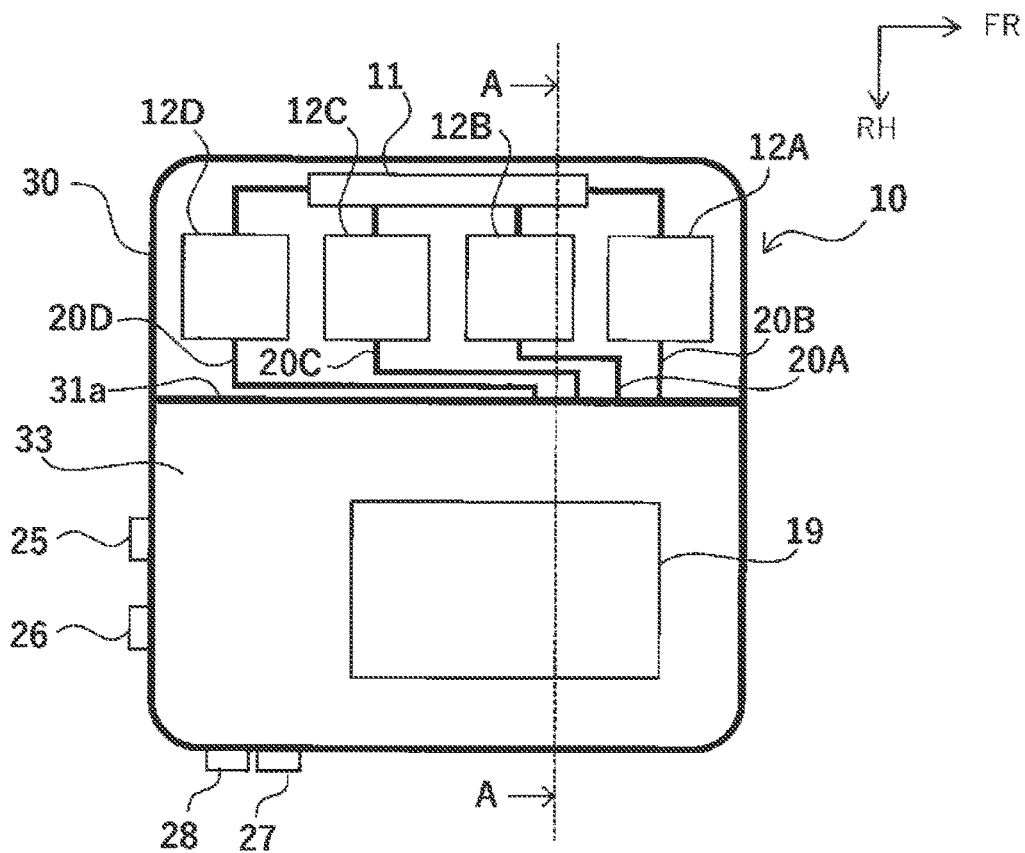
FIG. 12 is a top view in a state where the upper cover is removed and illustrates details of the structure of the power converter according to the first embodiment.

The wall portion 31a of the partition 31 is connected to a ceiling 33 of the space where the current sensor 13 and the IPM 14 are placed. The ceiling 33 is a part of the case 30 and may be made of the same material as the partition 31. An IPM substrate 19 integrated with an electronic control unit (ECU) is put on the ceiling 33. The IPM substrate 19 is connected to the IPM 14 across the ceiling 33. An upper cover 40 covering from the upper side of the reactor 12 to the upper side of the IPM substrate 19 is attached to an upper part of the case 30. FIG. 11 is a top view in a state where the upper cover 40 is attached and illustrates details of the structure of the FDC 10 according to the first embodiment. FIG. 12 is a top view in a state where the upper cover 40 is removed and illustrates details of the structure of the FDC 10 according to the first embodiment.

Figure 13:
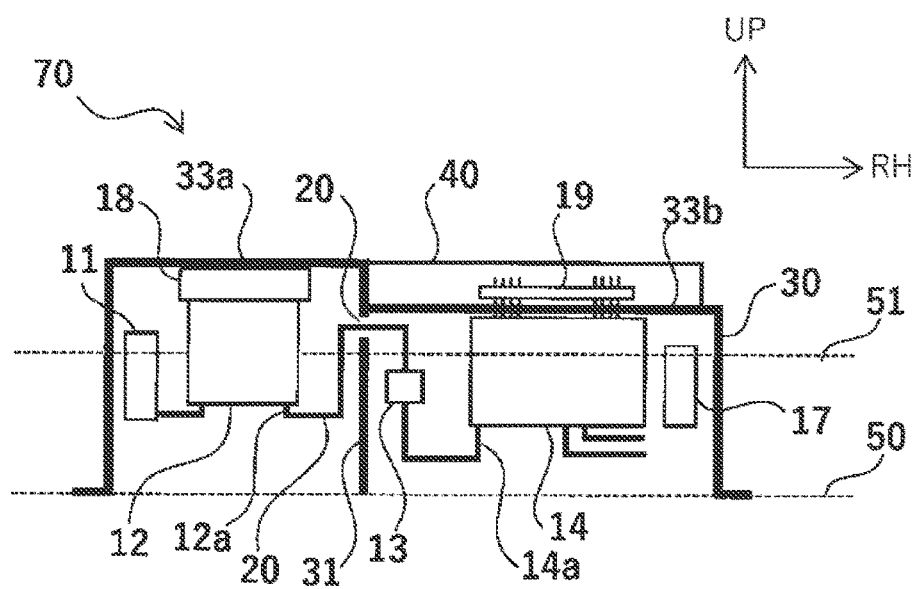
FIG. 13 is a view corresponding to the arrow view of the section taken along the arrow A-A in FIG. 8 and illustrates details of a structure of a power converter according to a second embodiment.

Next will be described an FDC according to a second embodiment. FIG. 13 is a view illustrating details of a structure of an FDC 70 according to the second embodiment. In FIG. 13, among component parts of the FDC 70 according to the second embodiment, a component part corresponding to a component part of the FDC 10 according to the first embodiment has the same reference sign as a reference sign assigned to the component part of the FDC 10 in the first embodiment. Note that FIG. 8 corresponds to a bottom view of the FDC 70 according to the second embodiment, and FIG. 13 corresponds to an arrow view of a section along an arrow A-A in FIG. 8.

As illustrated in FIG. 13, the case 30 of the FDC 70 includes a ceiling constituted by a high ceiling 33a and a low ceiling 33b. From the boundary between the high ceiling 33a and the low ceiling 33b, the partition 31 hangs down perpendicularly to the mounting surface 50. The inside of the FDC 70 is partitioned off into two spaces by the partition 31. The reactor 12 is accommodated in a space surrounded by the side walls of the case 30 of the FDC, the partition 31, and the high ceiling 33a. The current sensor 13 and the IPM 14 are accommodated in a space surrounded by the side walls of the case 30 of the FDC, the partition 31, and the low ceiling 33b. When the partition 31 is provided as such, radiant heat emitted from the reactor 12 is blocked by the partition 31. Further, the reactor 12 is isolated from the space where the current sensor 13 is provided, and therefore, heat transfer from the reactor 12 to the current sensor 13 via air is also reduced.

The reactor cooler 18 configured to cool the reactor 12 is provided between the reactor 12 and the high ceiling 33a. That is, in the second embodiment, the surface of the reactor 12 on the upper side as the first-side surface is cooled by the reactor cooler 18. In the second embodiment, the output terminal 12a of the reactor 12 is provided on the surface of the reactor 12 on the lower side as the second-side surface.

The partition 31 has the hole 32 through which the bus bar 20 is passed. A position where the hole 32 is provided is a part of the partition 31, the part being close to the ceilings 33a, 33b. This position is a side (the first side) opposite, across the plane 51, to a side (the second side) where the output terminal 12a of the reactor 12 is provided. When such a positional relationship is provided between the position of the output terminal 12a of the reactor 12 and the hole 32 via which the bus bar 20 passes through the partition 31, a long bus bar length is secured from the reactor 12 to the current sensor 13. The amount of heat transfer via the bus bar 20 is smaller as the length of the bus bar 20 is longer. Accordingly, a temperature increase in the current sensor 13 due to heat transfer from the reactor 12 to the current sensor 13 via the bus bar 20 is reduced.

The input terminal 14a of the IPM 14 to which the bus bar 20 is connected is provided on the surface, of the IPM 14, that faces the mounting surface 50, that is, the surface of the IPM 14 on the lower side. On this account, in the second embodiment, the bus bar 20 coming out of the hole 32 of the partition 31 is bent several times and connected to the input terminal 14a of the IPM 14 in the space where the current sensor 13 is placed. Since the bus bar 20 is bent, magnetic fluxes generated around the bus bar 20 are not unidirectional in the space where the current sensor 13 is placed. Accordingly, from the viewpoint of restraining magnetic fluxes in various directions from acting on the part where the current sensor 13 is provided, the configuration of the FDC 10 according to the first embodiment is more preferable.

In the second embodiment, the IPM substrate 19 integrated with the ECU is put on the low ceiling 33b. The IPM substrate 19 is connected to the IPM 14 across the low ceiling 33b. The upper cover 40 covering the upper side of the IPM substrate 19 is attached onto the low ceiling 33b.

Figure 14:
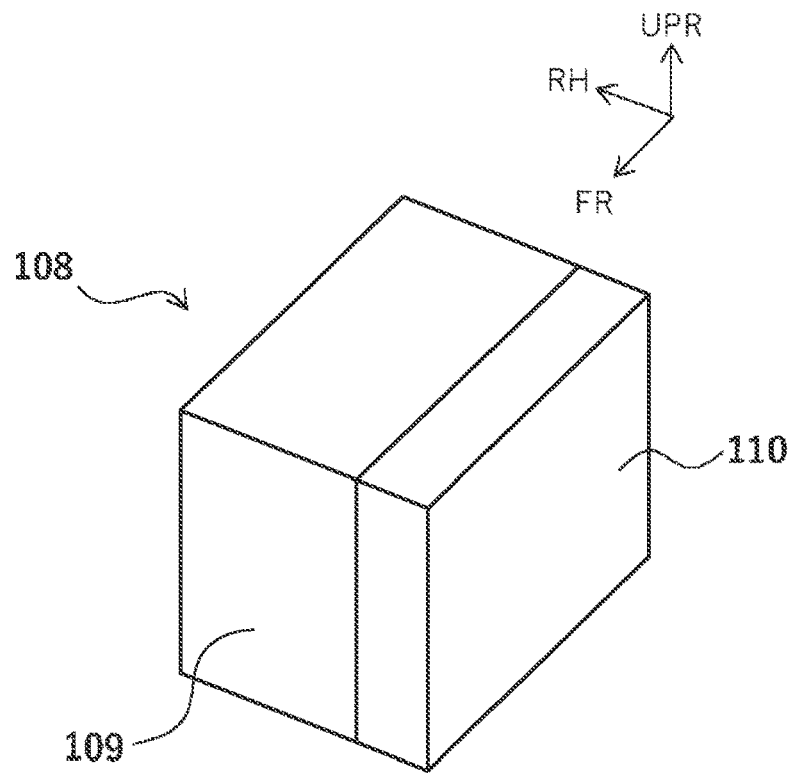
FIG. 14 is a view illustrating a modification of a positional relationship between a fuel cell stack and the power converter.

FIG. 14 is a view illustrating a modification of the positional relationship between the FC stack and the FDC. An FC unit 108 in this modification is configured such that an FDC 110 is attached to a lateral side of an FC stack 109. Accordingly, in this modification, a mounting surface where the FDC 110 is provided on the FC unit 108 is not a horizontal surface and is a vertical surface. The FDC 100 according to the first embodiment and the FDC 70 according to the second embodiment may be provided in an FC unit like the FDC 110 illustrated in this modification.

In the meantime, the form of the power train system of the fuel cell vehicle as illustrated in FIG. 1 is called a battery direct connection type. In the battery direct connection type, when the output voltage of the battery 6 is 350 V, for example, the voltage of 350 V is supplied to the inverter 4 as it is. When the output voltage of the FC stack 9 is 250 V, the FDC 10 boosts the voltage from 250 V to 350 V so that the voltage output from the FC unit 8 is equal to the output voltage of the battery 6.

As the form of the power train system of the fuel cell vehicle, there are a parallel boosting type and a serial boosting type in addition to the battery direct connection type. The fuel cell unit in which the power converter according to the present disclosure is provided is also applicable to the parallel boosting type and the serial boosting type.

Figure 15:
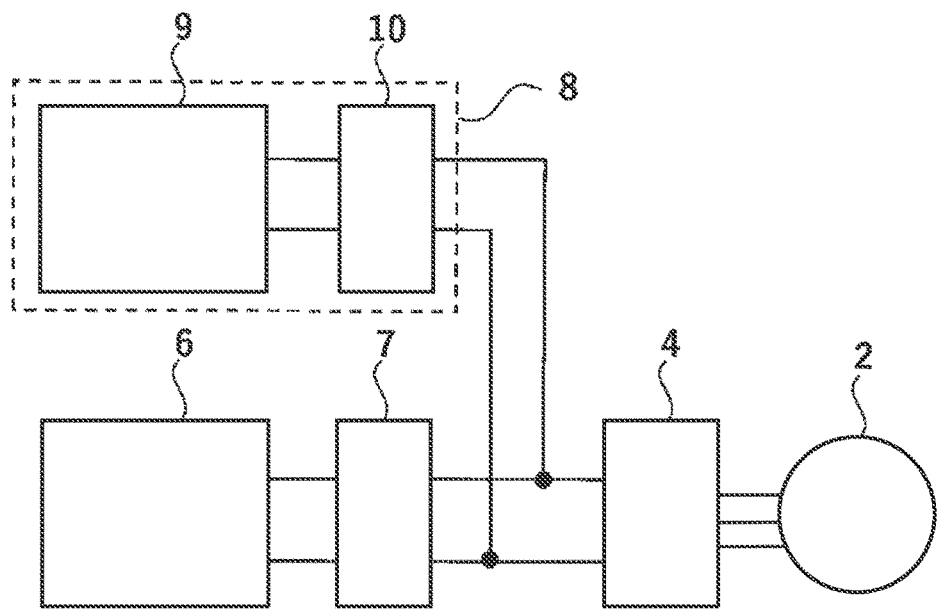
FIG. 15 is a schematic view of another example of the power train system of the fuel cell vehicle.

FIG. 15 is a schematic view illustrating a configuration of the parallel boosting type. In the parallel boosting type, a battery boost converter 7 is provided between a battery 6 and an inverter 4. The battery boost converter is referred to as a BDC. The BDC 7 is connected to the inverter 4 in parallel with the FDC 10. In the parallel boosting type, when the input voltage of the inverter 4 is set to 600V, for example, the FDC 10 boosts the output voltage of the FC stack 9 from 250 V to 600 V, and the BDC 7 boosts the output voltage of the battery 6 from 350 V to 600 V.

Figure 16:
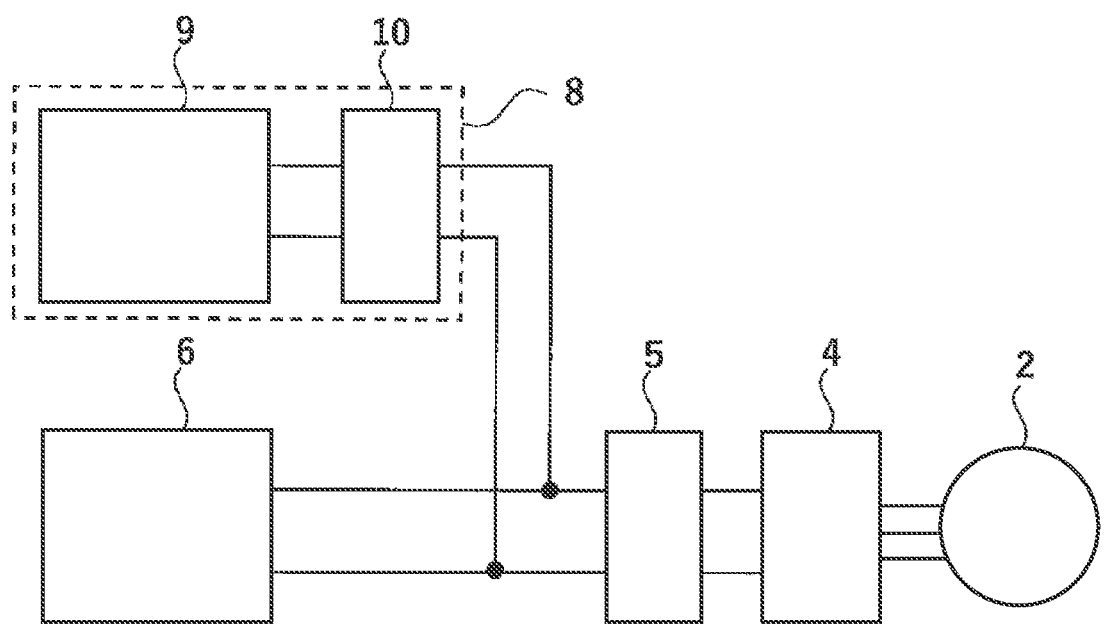
FIG. 16 is a schematic view of another example of the power train system of the fuel cell vehicle.

FIG. 16 is a schematic view illustrating a configuration of the serial boosting type. In the serial boosting type, the BDC 7 is provided between the battery 6 and the inverter 4 such that the BDC 7 is connected to the inverter 4 in series with the FDC 10. In the serial boosting type, when the output voltage of the battery 6 is 350 V and the input voltage of the inverter 4 is set to 600 V, for example, the FDC 10 boosts the voltage from 250 V to 350 V so that the voltage output from the FC unit 8 is equal to the output voltage of the battery 6. The BDC 7 boosts the voltage from 350 V to 600 V.

What is claimed is:

1. A power converter to be provided in a fuel cell unit, the power converter comprising:
   a reactor;
   a power module placed side by side with the reactor along a mounting surface of the power converter;
   a bus bar via which an output terminal of the reactor is connected to an input terminal of the power module;
   a current sensor provided on the bus bar; and
   a partition made of metal having a magnetic shielding effect, the partition being configured to separate the reactor from the current sensor, wherein:
   the output terminal of the reactor is provided on either one of a surface of the reactor on a first side and a surface of the reactor on a second side, the first side being a side farther from the mounting surface across a plane passing through a center of the reactor and parallel to the mounting surface, the second side being a side closer to the mounting surface from the plane; and
   on a side opposite to a side where the output terminal of the reactor is provided out of the first side and the second side, the bus bar extends to pass through the partition from a space where the reactor is placed to a space where the current sensor is placed.

2. The power converter according to claim 1, wherein:
   the partition includes a wall portion standing from the mounting surface, and a bottom portion placed between the reactor and the mounting surface and connected to the wall portion; and
   the wall portion is connected to a ceiling of a space where the power module and the current sensor are placed.

3. The power converter according to claim 2, wherein:
   the output terminal of the reactor is provided on the surface of the reactor on the first side;
   the input terminal of the power module is provided on a surface of the power module, the surface facing the mounting surface; and
   the bus bar passes through an end part of the wall portion on the second side and is connected to the input terminal of the power module.

4. The power converter according to claim 3, wherein a water-cooling cooler configured to cool the reactor is attached to the surface of the reactor on the second side.

5. The power converter according to claim 1, wherein a part of the bus bar at least from the partition to the input terminal of the power module is formed straight.

6. The power converter according to claim 5, wherein the bus bar is bent in a part from the output terminal of the reactor to the partition.

7. The power converter according to claim 1, wherein:
   a plurality of reactors is provided in line on the mounting surface; and
   the partition is provided along the line of the reactors.

* * * * *